(12) United States Patent
Pipe

(10) Patent No.: US 10,222,439 B2
(45) Date of Patent: Mar. 5, 2019

(54) SYSTEM AND METHOD FOR SPIRAL MULTISLAB MAGNETIC RESONANCE IMAGING

(71) Applicant: DIGNITY HEALTH, San Francisco, CA (US)

(72) Inventor: James Grant Pipe, Glendale, AZ (US)

(73) Assignee: Dignity Health, San Francisco, CA (US)

( * ) Notice: Subject to any disclaimer, the term of this patent is extended or adjusted under 35 U.S.C. 154(b) by 173 days.

(21) Appl. No.: 15/305,259

(22) PCT Filed: Apr. 13, 2015

(86) PCT No.: PCT/US2015/025534
§ 371 (c)(1),
(2) Date: Oct. 19, 2016

(87) PCT Pub. No.: WO2015/164109
PCT Pub. Date: Oct. 29, 2015

(65) Prior Publication Data
US 2017/0038447 A1    Feb. 9, 2017

Related U.S. Application Data

(60) Provisional application No. 61/983,660, filed on Apr. 24, 2014.

(51) Int. Cl.
*G01R 33/48* (2006.01)
*G01R 33/50* (2006.01)
(Continued)

(52) U.S. Cl.
CPC ..... *G01R 33/4835* (2013.01); *G01R 33/4818* (2013.01); *G01R 33/4826* (2013.01); *G01R 33/50* (2013.01); *G01R 33/56518* (2013.01)

(58) Field of Classification Search
CPC ............ G01R 33/4835; G01R 33/4818; G01R 33/4826; G01R 33/50; G01R 33/56518
See application file for complete search history.

(56) References Cited

U.S. PATENT DOCUMENTS 5,233,301 A    8/1993  Meyer et al.
5,270,654 A    12/1993 Feinberg et al.
(Continued)

FOREIGN PATENT DOCUMENTS

WO    WO2009037711 A2    3/2009

OTHER PUBLICATIONS

International Search Report and Written Opinion for PCT/US2015/025534 dated Jul. 22, 2015.

*Primary Examiner* — Rodney A Bonnette
(74) *Attorney, Agent, or Firm* — Quarles & Brady LLP

(57) ABSTRACT

A magnetic resonance imaging (MRI) system and method for controlling the MRI system is provided. The method includes directing the MRI system to perform a pulse sequence that includes generating a RF excitation pulse to excite spins in slice locations within a selected slab to produce an echo train from the slab that is formed by a plurality of echoes. The sequence also includes applying a slice-encoding gradient to spatially encode echoes associated with a different slice in the slab, and applying readout gradients during the echo train to acquire MR data from the slab, the readout gradients including a first sampling strategy defining a spiral-in k-space trajectory and a second sampling strategy defining a spiral-out k-space trajectory, wherein the MRI system is directed to repeat the sequence such that a plurality of subsequent selected slabs are excited and MR data is acquired therefrom.

19 Claims, 11 Drawing Sheets

(51) Int. Cl.
*G01R 33/483* (2006.01)
*G01R 33/565* (2006.01)

(56) References Cited

U.S. PATENT DOCUMENTS

| | | | |
|---|---|---|---|
| 5,539,313 A * | 7/1996 | Meyer | G01R 33/446 |
| | | | 324/307 |
| 5,650,723 A * | 7/1997 | Meyer | G01R 33/446 |
| | | | 324/307 |
| 5,779,636 A | 7/1998 | Kanazawa | |
| 7,750,632 B2 | 7/2010 | Qian et al. | |
| 8,405,395 B2 | 3/2013 | Setsompop et al. | |
| 9,651,645 B2 * | 5/2017 | Fielden | G01R 33/565 |
| 2006/0062731 A1 | 3/2006 | Bammer et al. | |
| 2007/0167717 A1 | 7/2007 | James et al. | |
| 2008/0054899 A1* | 3/2008 | Aksoy | G01R 33/5611 |
| | | | 324/307 |
| 2009/0072827 A1 | 3/2009 | Hargreaves | |
| 2011/0068790 A1 | 3/2011 | Cahmberlain et al. | |

* cited by examiner

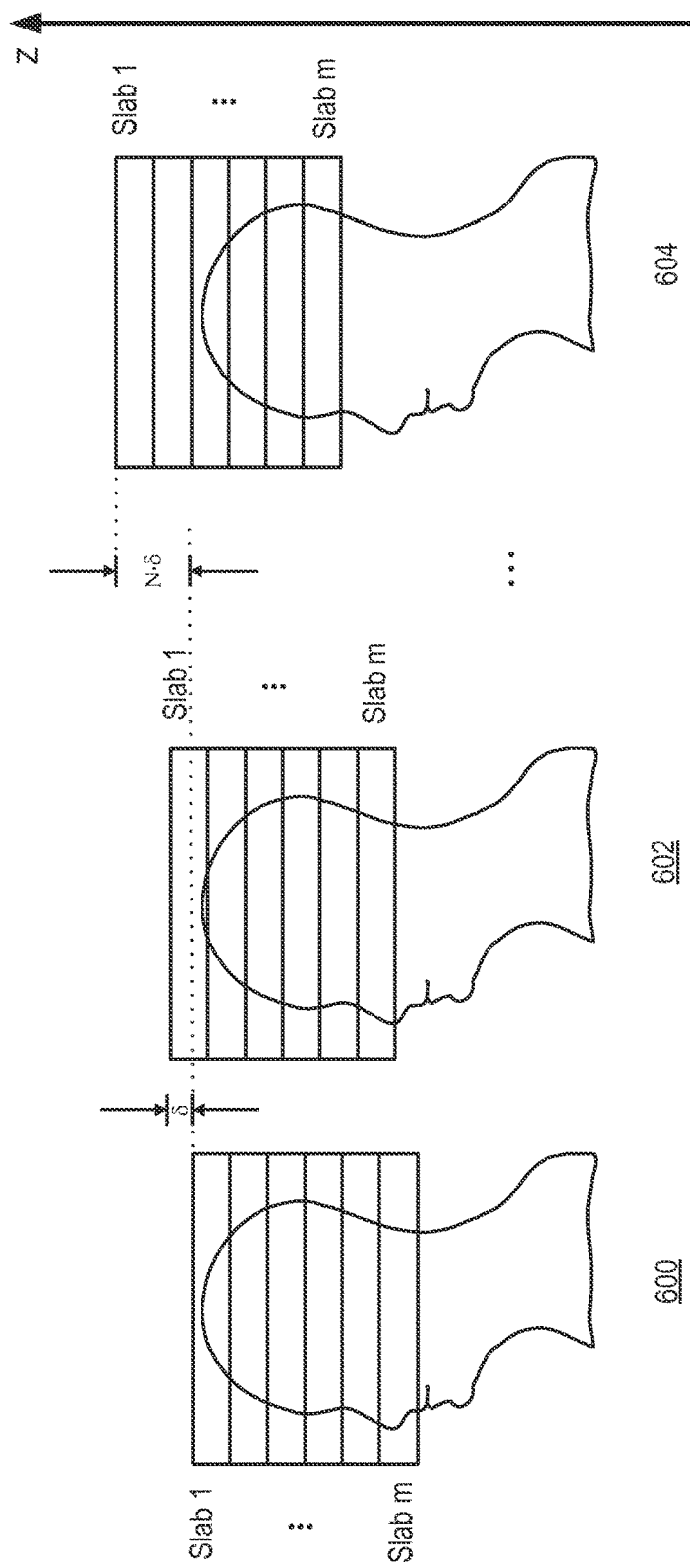

SYSTEM AND METHOD FOR SPIRAL MULTISLAB MAGNETIC RESONANCE IMAGING

CROSS-REFERENCE TO RELATED APPLICATIONS

This application represents the national stage entry of PCT International Application No. PCT/US2015/025534 filed Apr. 13, 2015 and is based on, claims priority to, and incorporates herein by reference in its entirety U.S. Provisional Application Ser. No. 61/983,660 filed on Apr. 24, 2014, and entitled "SYSTEM AND METHOD FOR SPIRAL MULTISLAB MAGNETIC RESONANCE IMAGING."

STATEMENT REGARDING FEDERALLY SPONSORED RESEARCH

Not Applicable

BACKGROUND

The present disclosure relates generally to systems and methods for magnetic resonance imaging (MRI) and, in particular, to systems and methods for performing a spin-echo MRI process with rapid scan times, while still maintaining suitably a high signal-to-noise ratio (SNR) and suitably high-resolution images.

Any nucleus that possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_Z$ is produced in the direction of the polarizing field, but the randomly oriented magnetic components in the perpendicular, or transverse, plane (x-y plane) cancel one another. If, however, the substance, or tissue, is subjected to a magnetic field (excitation field B1) which is in the x-y plane and which is near the Larmor frequency, the net aligned moment, $M_Z$, may be rotated, or "tipped", into the x-y plane to produce a net transverse magnetic moment $M_t$, which is rotating, or spinning, in the x-y plane at the Larmor frequency. The practical value of this phenomenon resides on signals which are emitted by the excited spins after the pulsed excitation signal $B_1$ is terminated. Depending upon of biologically variable parameters such as proton density, longitudinal relaxation time ("$T_1$") describing the recovery of $M_Z$ along the polarizing field, and transverse relaxation time ("$T_2$") describing the decay of $M_t$ in the x-y plane, this nuclear magnetic resonance ("NMR") phenomena is exploited to obtain image contrast using different measurement sequences and by changing imaging parameters.

When utilizing NMR to produce images, a technique is employed to obtain NMR signals from specific locations in the subject. Typically, the region to be imaged (region of interest) is scanned by a sequence of NMR measurement cycles that vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The acquisition of the NMR signals samples is referred to as sampling k-space, and a scan is completed when enough NMR cycles are performed to fully sample k-space.

One such process is referred to as the Fourier transform (FT) imaging technique, which is also referred to as "spin-warp" imaging. The spin-warp technique employs a variable amplitude phase encoding magnetic field gradient pulse prior to the acquisition of NMR spin-echo signals to phase encode spatial information in the direction of this gradient. In a two-dimensional ("2D") implementation, for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2D pulse sequence, the magnitude of the phase encoding gradient pulse $G_y$ is incremented in the sequence of views that are acquired during the scan to produce a set of NMR data from which an entire image can be reconstructed.

In a three-dimensional ("3D") implementation of the spin-warp method phase encoding of the spin-echo signals is performed along two orthogonal axes. In particular, a thick slab of spins is excited by applying a slab-selection gradient ($G_z$) in the presence of a selective RF excitation pulse and then a first phase encoding gradient ($G_z$) along the same axis and a second phase encoding gradient ($G_y$) are applied before the NMR signal acquisition in the presence of a readout gradient ($G_x$). For each value of the $G_z$ phase encoding gradient, the $G_y$ phase encoding is stepped through all its values to sample a three-dimensional region of k-space. By selectively exciting a slab, NMR signals are acquired from a controlled three-dimensional volume.

Commonly-used pulse sequences for generating $T_1$, $T_2$ and proton density-weighted imaging include "fast" spin-echo techniques, wherein a number of spin-echo signals forming a spin-echo train are generated due to multiple refocusing pulses following each radio-frequency (RF) excitation. For example, single-slab, 2D $T_2$-weighted turbo spin echo (TSE) imaging techniques have been utilized to obtain high signal-to-noise ratio (SNR) and high resolution images, although such approaches do not fully utilize the scan time. Alternatively, multi-slab, 3D TSE imaging provides higher scan efficiency compared to 2D TSE, but is affected by ringing and venetian blind artifacts in the slice direction.

TSE-type sequences result in increased specific absorption rate (SAR) in tissue, which limits the utility of the technique due to FDA guidelines on power deposition, as well as magnetization transfer (MT) saturation, particularly at high polarizing fields, which therefore reduces imaging efficiency. Hence, various approaches have been proposed to help minimize the number of RF pulses needed and, thereby, the SAR, while maximizing efficiency and reducing artifacts. For example, some 3D TSE techniques have implemented spiral k-space trajectories, which provide advantages over conventional Cartesian approaches, including higher SNR efficiency, decreased scan time, and reduced number of RF pulses. In particular, as illustrated in FIGS. 1A and 1B, some readout strategies configure readout gradients to achieve uniform, or non-uniform, "spiral-in" or "spiral-out" trajectories for sampling k-space. Specifically, spiral methods typically sample k-space with an Archimedean or similar trajectory that begin at the k-space center and spiral to the edge (spiral-out), as illustrated in FIG. 1B, or its reverse, ending at the origin (spiral-in), as illustrated in FIG. 1A.

However, spiral imaging methods present additional complications and are often difficult to implement successfully, as images are typically subject to blurring and distortion caused by sensitivity to off-resonance and eddy current artifacts. For instance, as shown in FIG. 2, in many approaches, applied readout gradients 200 either do not align spin echoes 202 with the center of k-space, or only half of each echo is acquired if the spiral starts from the spin echo point (not shown).

Therefore, given the above shortcomings, there is a need for magnetic resonance imaging systems and methods that yield suitably high-SNR and suitably high-resolution within very rapid scan times.

SUMMARY

The present disclosure overcomes the aforementioned drawbacks by providing a magnetic resonance imaging (MRI) system and method for controlling the MRI system to use spiral readout trajectories in a multiple spin-echo acquisition of full spin-echo signals centered about the k-space origin. Thus, the system and method are capable of generating "true" spin-echo images, while controlling the number of RF pulses utilized. The present disclosure may also use a non-uniform phase encoding scheme to reduce "ringing" artifacts in the slice direction of an excited slab, and implement a shifting-slab approach that facilitates user optimization of both repetition time and echo train, while controlling "venetian blinds" artifacts, In accordance with one aspect of the present disclosure, a method for controlling a magnetic resonance imaging (MRI) system is disclosed. The method includes directing the MRI system to perform a pulse sequence that, in a given repetition time (TR), includes i) generating a RF excitation pulse to excite spins in a plurality of slice locations within a selected slab to produce an echo train from the selected slab that is formed by a plurality of echoes and ii) applying a slice-encoding gradient to spatially encode each of the plurality of echoes associated with a different slice in the selected slab. The pulse sequence also includes iii) applying readout gradients during the echo train to acquire MR data from the selected slab, the readout gradients including a first sampling strategy that defines a spiral-in k-space trajectory and a second sampling strategy that defines a spiral-out k-space trajectory. For each TR, the MRI system is directed to repeat the pulse sequence such that each of a plurality of subsequent selected slabs is excited and MR data is acquired from each of the plurality of subsequent selected slabs.

In accordance with another aspect of the present disclosure, a magnetic resonance imaging (MRI) system is disclosed that includes a magnet system configured to generate a polarizing magnetic field about at least a portion of a subject arranged in the MRI system, a plurality of gradient coils configured to apply a gradient field to the polarizing magnetic field, and a radio frequency (RF) system configured to apply an RF excitation field to a region of interest (ROI) in the subject and acquire MR image data from the ROI. The MRI system also includes a computer system programmed to control the plurality of gradient coils and the RF system to perform a pulse sequence that varies with each repetition time (TR). The pulse sequence for a given TR includes performing the following for a given slab i) applying an RF excitation pulse, using the RF system, to excite spins in a plurality of slice locations within the given slab, ii) generating a successive plurality of RF refocusing pulses, using the RF system, to produce an echo train including a plurality of echoes, and iii) applying a varying slice-encoding gradient, using the plurality of gradient coils, to spatially encode the echo train relative to the slice locations within the given slab. The pulse sequence also includes iv) applying readout gradients during the plurality of echoes, using the plurality of gradient coils, to acquire MR data from the given slab, wherein the readout gradients including a first sampling strategy that defines a spiral-in k-space trajectory, and a second sampling strategy that defines a spiral-out k-space trajectory. For each subsequent TR, a different slab from the given slab in a prior TR is excited to acquire MR data from the different slab using a different spiral-in k-space trajectory and a different spiral-out k-space trajectory.

In accordance with yet another aspect of the present disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The MRI system also includes a radio frequency (RF) system configured to apply an RF excitation field to a region of interest (ROI) in the subject and acquire MR image data from the ROI and a computer system programmed to control the plurality of gradient coils and the RF system to perform a spin-echo pulse sequence that samples k-space using a spiral-in k-space trajectory and a spiral-out k-space trajectory to fully sample each echo train.

The foregoing and other advantages of the invention will appear from the following description.

BRIEF DESCRIPTION OF THE DRAWINGS

FIG. 6A is an illustration depicting a shifting slab approach for use in accordance with the present disclosure.

DETAILED DESCRIPTION

The present disclosure is directed to systems and methods for acquiring and reconstructing NMR data that provide higher imaging efficiency while controlling artifacts in an approach suitable for multi-slab three-dimensional (3D) imaging. As will be described, the present disclosure provides a fast or turbo, spin-echo-imaging technique that makes use of spiral trajectory k-space traversal, along with a non-uniform phase encoding along the slice direction, and a shifting-slab approach to achieve high signal-to-noise ratio (SNR) and high-resolution imaging with very rapid scan time.

Figure 3A:
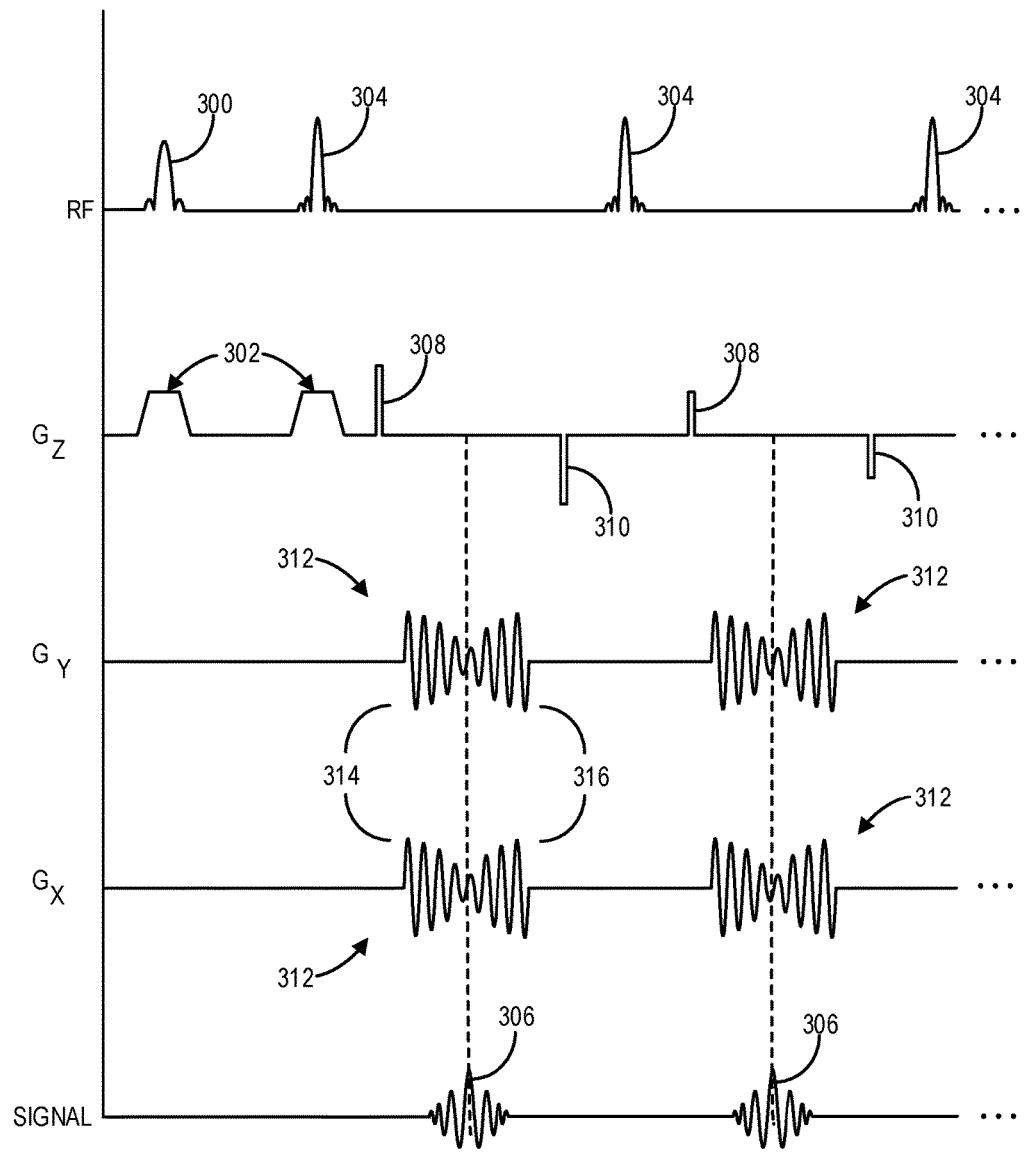
FIG. 3A is an illustration of an example pulse sequence diagram in accordance with the present disclosure.

Referring to FIG. 3A, an example pulse sequence diagram, in accordance with embodiments of the present disclosure, is illustrated. Specifically, the sequence begins with a radio-frequency (RF) excitation pulse 300 configured to excite spins in a number of slice locations within multiple slices or a slab in the presence of slice selecting gradients 302 applied along the slice direction (in this example, $G_z$). The thickness of each excited slab may include a portion of a volume of interest (VOI) or an entire VOI. In addition, a number of RF refocusing pulses 304 following the excitation pulse 300 may be played out to produce an echo train that includes a number of spin-echoes 306. The time between each successive excitation pulse 300 determines a sequence repetition time (TR).

Phase encoding along the slice direction is achieved by virtue of slice-encoding gradients 308 applied in the slice direction. The slice-encoding gradients 308 may be configured to traverse, in this example, $k_z$ in any manner using waveforms defined according to desirable profiles, amplitudes, and durations. As shown in the example of FIG. 3A, the slice-encoding gradients 308 may be defined using a pulse of varying amplitudes, although other waveforms are possible, applied before each echo to spatially encode the echo along the slice direction. In some aspects, each slice encoding step may be associated with a different slice in the excited slab. In addition, each of the slice-encoding gradients 308 may be followed by a phase-rewinding gradient 310 to restore accumulated phase before application of subsequent RF refocusing pulses 304.

Figure 1A:
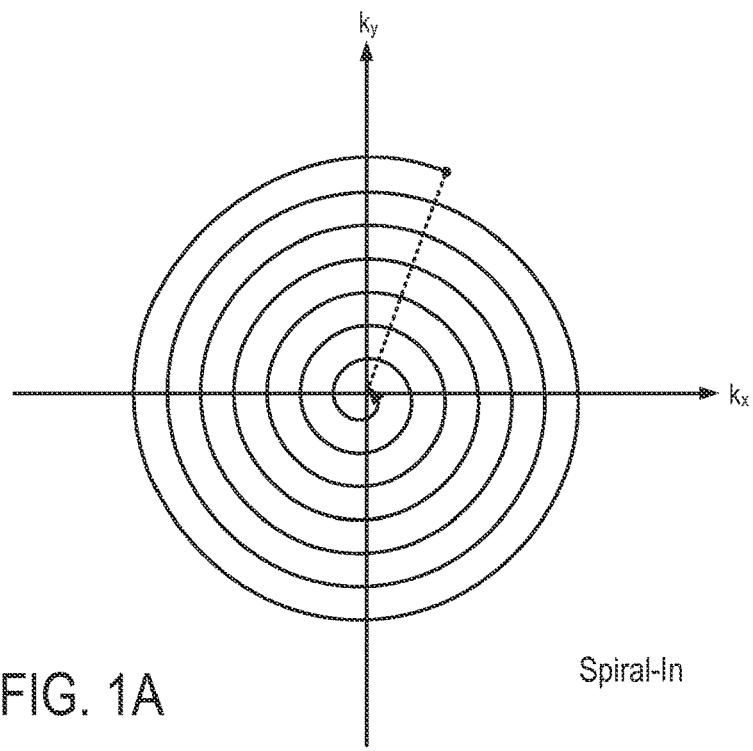
FIG. 1A is a graphic representation of an example "spiral-in" k-space trajectory.
Figure 1B:
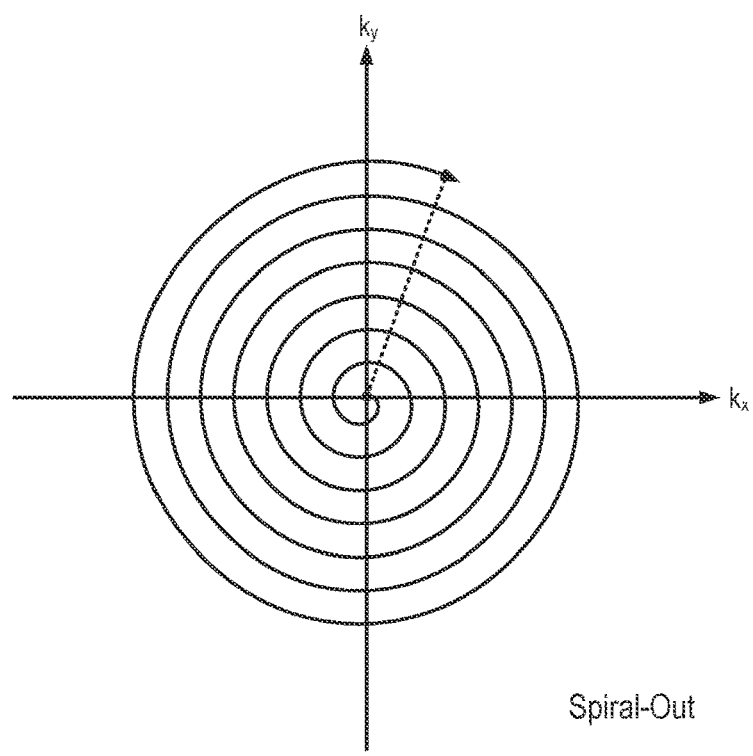
FIG. 1B is a graphic representation of an example "spiral-out" k-space trajectory.
Figure 2:
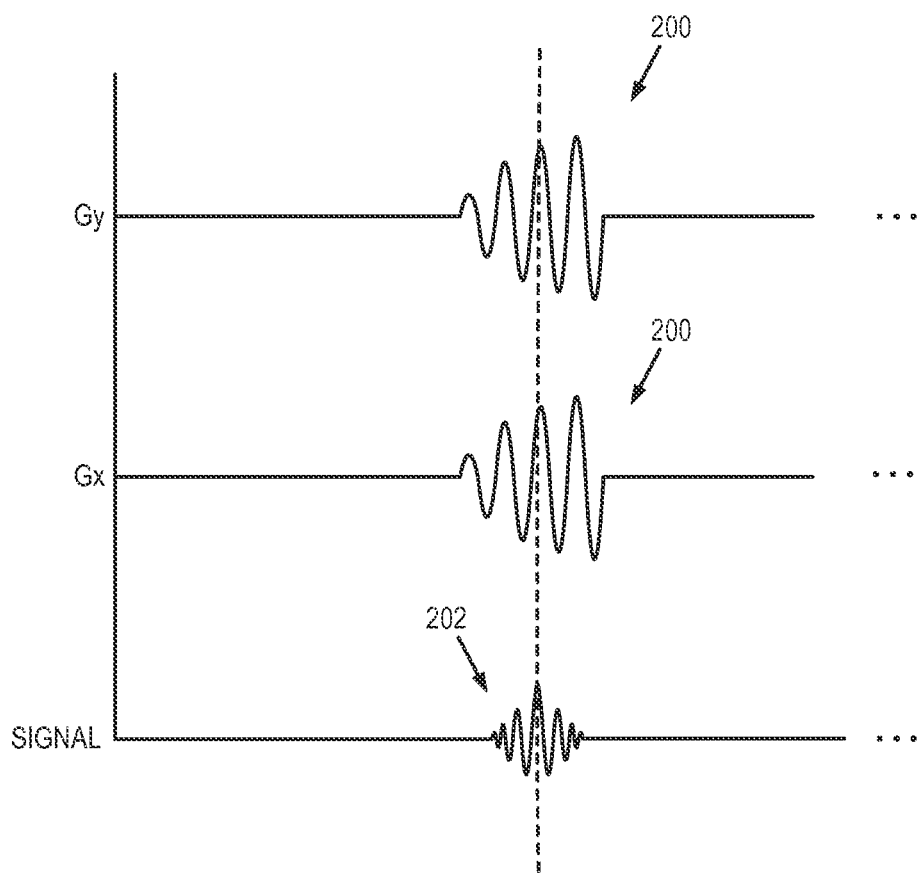
FIG. 2 is an illustration of an example pulse sequence diagram utilizing a spiral-out readout.

In accordance with the present disclosure, spiral trajectories, which can be designed to afford efficient use of gradient performance and the ability to span k-space in a single shot, may be used. That is, as described, spiral trajectories provide more effective coverage of k-space compared to Cartesian sampling schemes, since k-space corners are not acquired, the average gradient amplitude can be maximized, and uniform trajectory coverage can be readily achieved. General approaches include sampling k-space by way of a "spiral-out" trajectory (FIG. 1B) in the $k_x$-$k_y$ plane, wherein readout is designed such that k-space is traversed from the origin to the edge along a spiral path. Conversely, a "spiral-in" trajectory follows an inverse path. However, in such approaches, the spin echoes generated typically do not align with the center of k-space, as shown in FIG. 2, or only portions of each echo are acquired. By contrast, the present disclosure provides a k-space traversal approach that "fully collects" the generated spin-echoes, each echo being centered at the k-space origin, therefore providing a higher SNR efficiency. That is, by "fully collecting" the spin echoes means that the spin echo is aligned with the center of k-space and both the leading end of the echo train and the trailing end of the echo train is sampled. This stands in stark contrast with sampling strategies that either do not align the spin echo with the center of k-space or only samples one of the leading or trailing end of the echo train to achieve alignment of the spin echo with the center of k-space. By, collecting data along the full echo with the spin echo point centered at the k-space origin, a higher SNR efficiency is achieved without extending scanning time.

Referring particularly to the example shown in FIG. 3A, readout gradients 312 applied along the phase encode (in the illustrated example, $G_y$) and the frequency encode (in the illustrated example, $G_x$) directions may be configured such that the entire k-space plane (in the illustrated example, $k_x$-$k_y$) is traversed between each of the RF refocusing pulses 304 along spiral trajectories. Specifically, waveforms describing each of the readout gradients 312 include a first sampling strategy 314 and a second sampling strategy 316. As shown, the combination of the first sampling strategy 314 and a second sampling strategy 316 extends across the full echo train 316. In the illustrated example, the first sampling strategy 314 defines a spiral-in k-space trajectory and the second sampling strategy 316 defines a spiral-out k-space trajectory. Of course, other configurations are possible. In addition, the timing of the readout gradients 312 relative to the refocusing pulses 304 may be configured to allow for each generated spin-echo 306 to be aligned with the center of k-space, as shown in FIG. 3A. In some aspects, the spiral trajectories in the k-space plane (in this example, $k_x$-$k_y$) may be defined using an Archimedean function of uniform or non-uniform density in k-space, although other functions may be possible. For example, the readout gradients 312 may be designed such that spiral trajectories provide a more dense sampling closer to the center of the k-space plane (in this example, $k_x$-$k_y$), and a more sparse sampling along the periphery of the k-space plane.

Figure 3C:
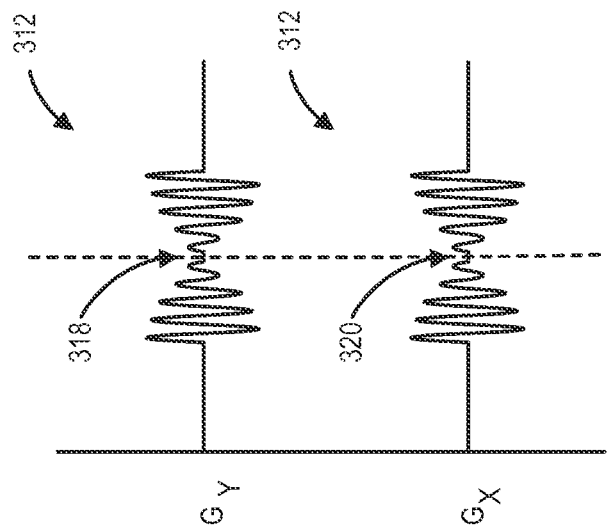
FIG. 3C is an illustration of another example modification of phase and frequency encode gradient waveforms of FIG. 3A.
Figure 3B:
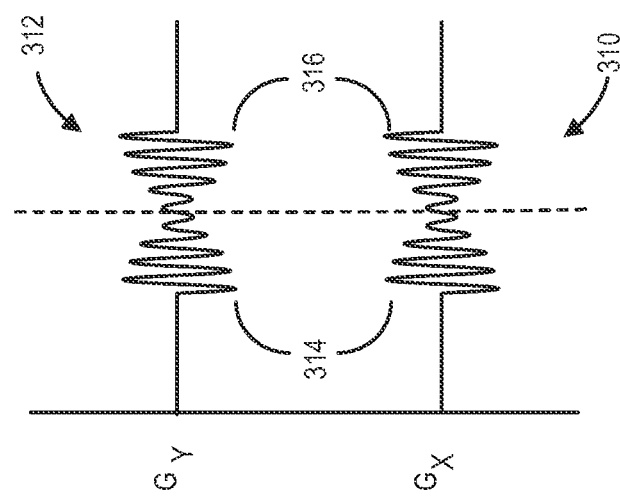
FIG. 3B is an illustration of an example modification of phase and frequency encode gradient waveforms of FIG. 3A.

In some variations, the relative polarity of the waveforms associated with the respective first sampling strategy 314 and second sampling strategy 316 of the readout gradients 312 may be configured such that application of the readout gradients 312 results in no appreciable phase shift along respective gradient directions. For example, as shown in FIG. 3B, the polarity of the first part 314 relative to and second part 316 is inverted, resulting in the time integral of the readout gradients 312 to be essentially zero. In other variations not explicitly shown in FIG. 3A, rewinder gradients, or gradients returning the k-space trajectory back to the origin of the k-space plane (again, the k.sub.x-k.sub.y plane in the illustrated example), in association with the readout gradients 312 may be also utilized, as well as first order moment flow compensating gradients. In yet other variations, accompanying short periods 318 may be inserted during readout, for example, between the first sampling strategy 314 and the second sampling strategy 316, as shown in FIG. 3C, or at the beginning of the readout gradients 312, to facilitate acquisition of calibration data at the center of k-space. In some designs, various combinations of the above-mentioned variations may be utilized. In some aspects, separate images, such as, fat and water images, may be efficiently produced by sampling respective spiral-in and spiral-out trajectories corresponding to the first sampling strategy 314 and second sampling strategy 316 of the readout gradients 312.

As described, for every slab excited, the same spiral-in/spiral-out trajectories in the k-space plane are traversed by virtue of the same readout gradients 312 played out in association with each of the spin-echoes 306 in the echo train, while a phase encoding (in this example, $k_z$) is varied between each echo. This creates an effective three-dimensional "stack-of-spirals" that separates the slab into multiple slices. In some aspects, each slab may include a few slices, for example, 3 or 4 slices, although other values are possible.

Figure 4B:
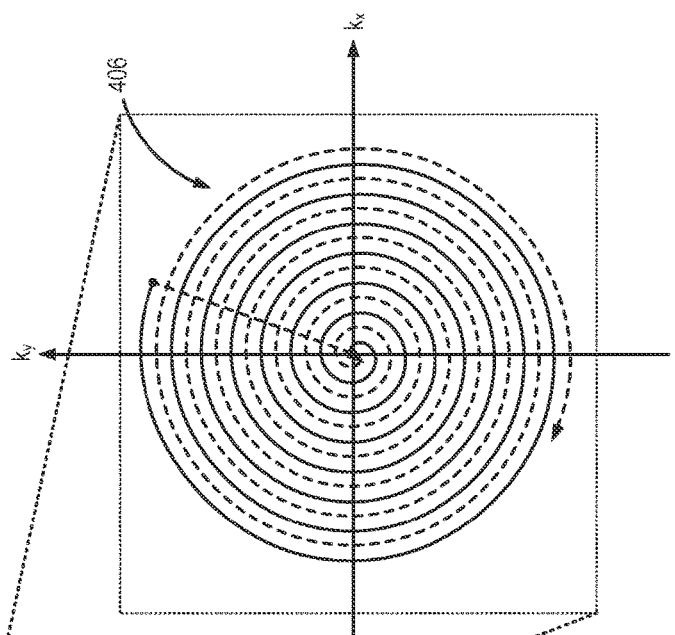
FIG. 4B is a graphic representation of non-uniform phase encoding along a slice direction, in accordance with the present disclosure.
Figure 4A:
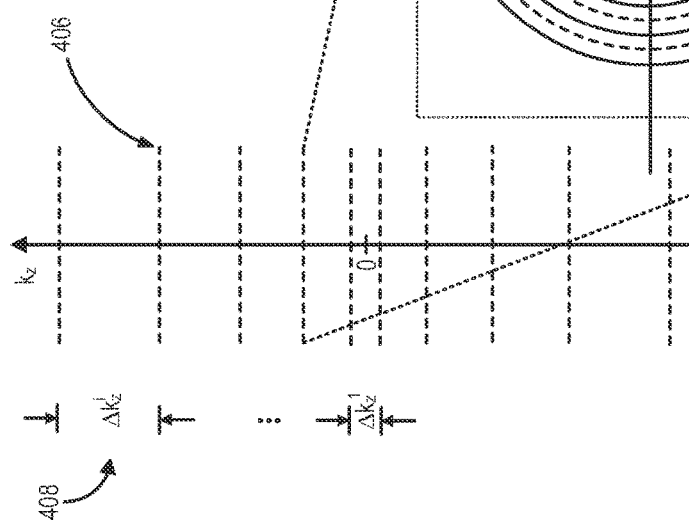
FIG. 4A is a graphic representation of uniform phase encoding along a slice direction.
Figure 4A:
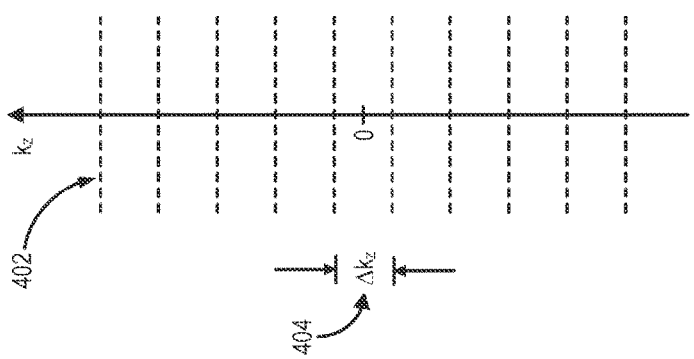

Referring to FIG. 4A, some methods employ phase encodings that separate the spiral-out trajectories 402 by a uniform spacing 404, for example, $\Delta k_z$, along the $k_z$ direction. However, since generally a thin slab is excited, resulting in a limited number of slice phase encoding steps, such approaches create ringing artifacts that arise from Fourier leakage. By contrast, the present disclosure can use a non-uniform spacing to stategically overcome or control such artifacts. Specifically, as shown in FIG. 4B, each subsequent spiral-in/spiral-out trajectory 406 in the $k_x$-$k_y$ plane may be separated along the $k_z$ direction by a variable spacing 408, $\Delta k_z^i$, which may vary in any manner along $k_z$. In some aspects, it may be desirable for $\Delta k_z^i$ to have smaller values when sampling close to the origin and have larger values further away from the origin or at the periphery. In other aspects, the $k_z$ locations may be selected such that the sampling density coefficients are equal to the inverse of the weights from a typical anti-ringing filter. In addition, the phase ordering of $k_z$ can be altered to change the effective time to echo.

Due to the way that the phase encoding (in this example, $k_z$) is achieved, fewer slices may be created compared with the number of collected phase encodings. However, if desired, the number of slices may be increased using suitable approaches, such as partial Fourier techniques. In addition, if the phase encodings are all windowed in a similar manner, this may "window" the data in $k_z$. Thus, the potential for ringing in the slice direction can be reduced without a loss of SNR. This lack of "Gibbs ringing" in the slice direction may be beneficial for 3D MRI methods that use thicker contiguous slices, such as slice thicknesses greater than 1 mm.

Figure 5:
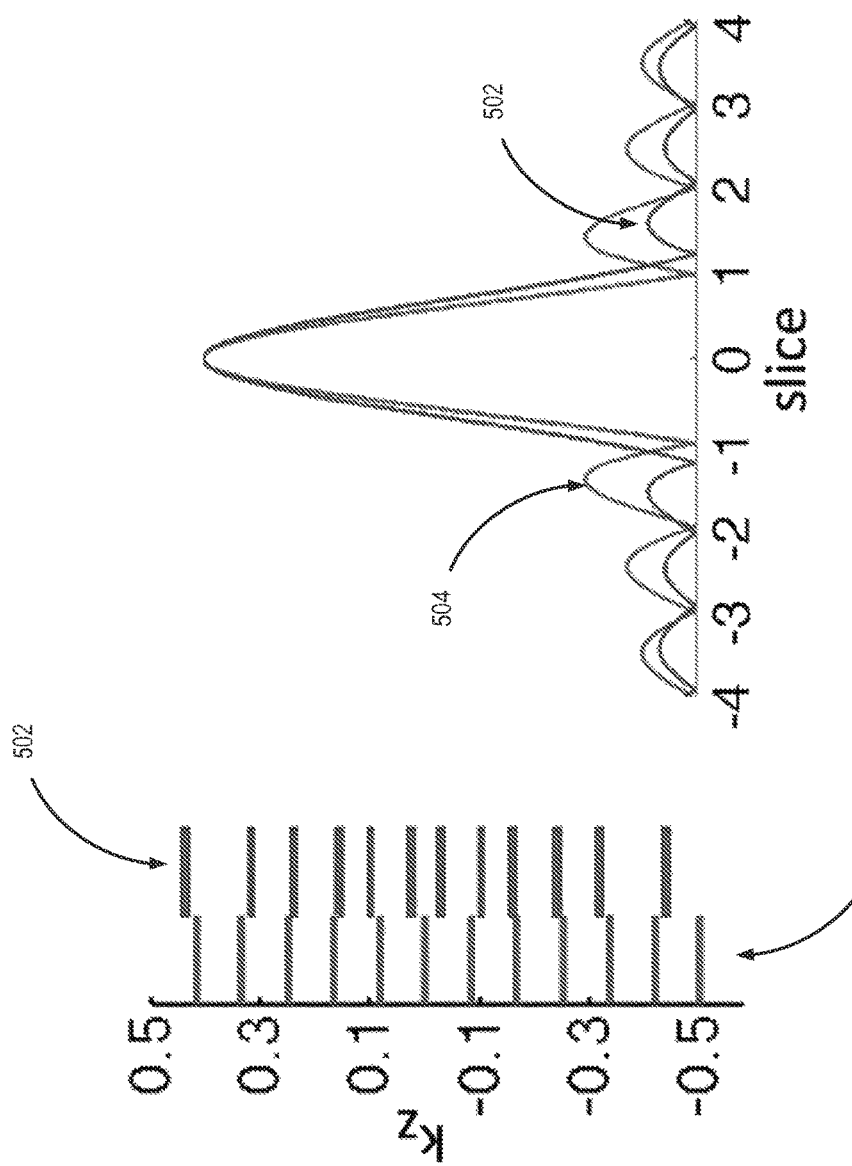
FIG. 5 is a graphic comparison of a point spread function (PSF) for uniform and non-uniform phase encoding along a slice encoding direction.

By way of example, FIG. 5 illustrates a comparison between a non-uniform slice phase encoding scheme 502 with oversampling and a conventional uniform sampling 504, whereby 8 slices are encoded, and so 12 encoding steps are acquired to more densely sample the center of k-space. As shown, ringing artifacts for the non-uniform $k_z$ spacing are reduced, as seen in the reduced lobes of the corresponding point spread function (PSF). Moreover, the SNR loss due to non-uniform signal weighting in the discrete Fourier transform is also eliminated (not shown in the figure).

Figure 6B:
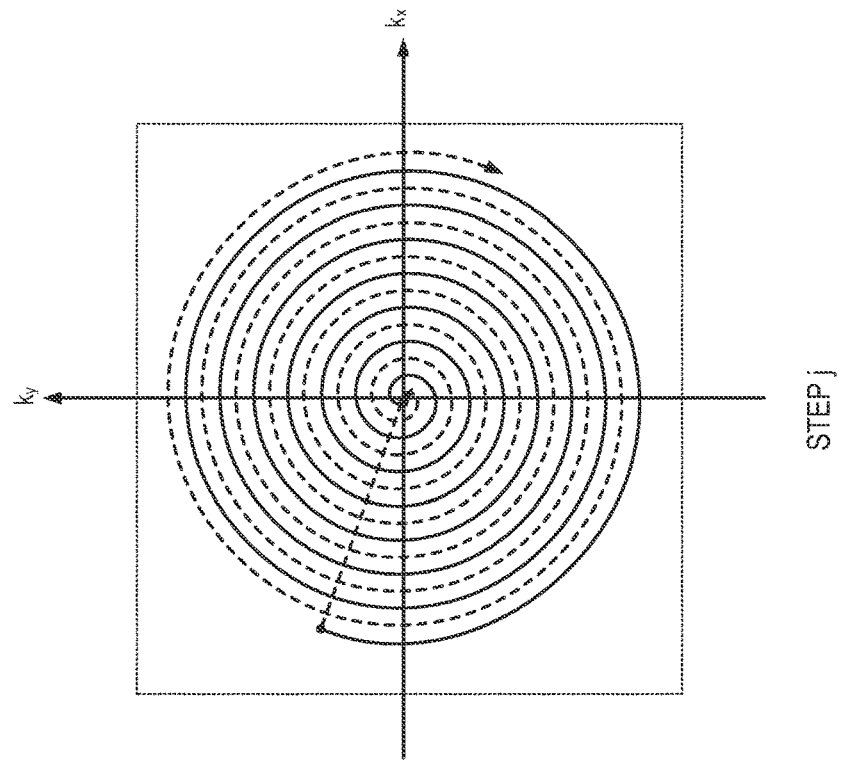
FIG. 6B is a pair of k-space samplings showing an offset that can be used in accordance with the present disclosure to perform spiral interleafing.
Figure 6B:
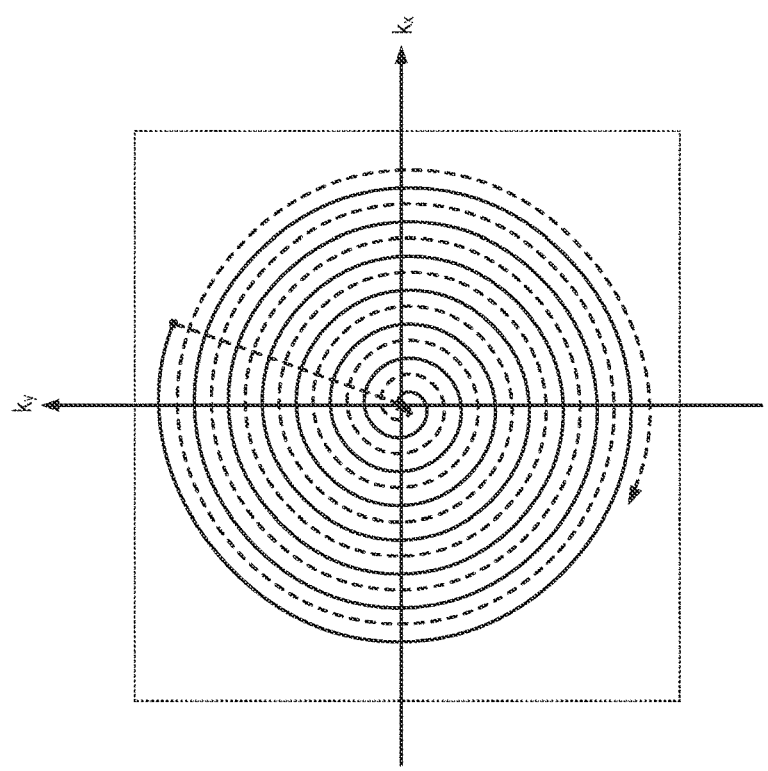

Turning to FIG. 6A, an example is shown illustrating application of an imaging approach as described. Specifically, in a first iteration step 600, multiple interleaved slabs may be excited and encoded identically, as described, all collecting the same spiral interleaf in the $k_x$ and $k_y$ directions. In particular, each spiral interleaf may be collected such that all locations in the VOI are in a "flat" region of at least one excited slab. Hence, there will be a slight overlap at the edges of slabs. This approach facilitates Fourier transformation in the slice direction to reconstruct an ($k_x$, $k_y$) interleaf for any desired slice location, Z, in each slab. It noteworthy that this step 600 collects MR data in a manner that is readily amenable to the use of a direct Fourier transform (DFT). That is, this step 600 facilitates reconstruction of the MR imaging data at arbitrary Z locations, which is reasonably efficient since transformation is performed across a few $k_z$ encodings to make a few Z locations. So far, the same spiral interleaf in the $k_x$ and $k_y$ directions is now represented at every desired slice location. In addition, there will be some variation, that is cyclical, in the data along Z reflecting the slice profiles, In a second iteration step 602, all the slabs may be shifted relative to the first step 600 by some amount, δ, in the Z direction, and the above-described acquisition process repeated, whereby a different spiral interleaf ($k_x$, $k_y$) is utilized. For example, as illustrated in FIG. 6B, the k-space samplings for two steps, "step i" and "step j", are illustrated. In particular, as described above, multiple interleaved slabs may be excited and encoded identically, as described, all collecting the same spiral interleaf in the $k_x$ and $k_y$ directions but offset. Subsequently, all slab data sets described by the different interleaf may be transformed to the same Z locations corresponding to the previous interleaf. These MR data sets may complement each other, although the cyclical pattern from the varying slice profiles may be shifted slightly in the Z direction, since the slabs were shifted accordingly.

The process is repeated until a desired number, "N", of MR data acquisitions completed at step 604. That is, a number of iteration steps, N, that include a number of shifts along the Z direction and collection of a full set of N interleafs, may be performed. In some aspects, the amount of shifting, δ, in the Z direction may be designed such that a bottom slab is shifted by (N−1)/N times the slab thickness from the top slab. As such, a gridding of the acquired data followed by a Fourier transform may be performed in the x and y directions, to create the final sets of images.

Figure 7:
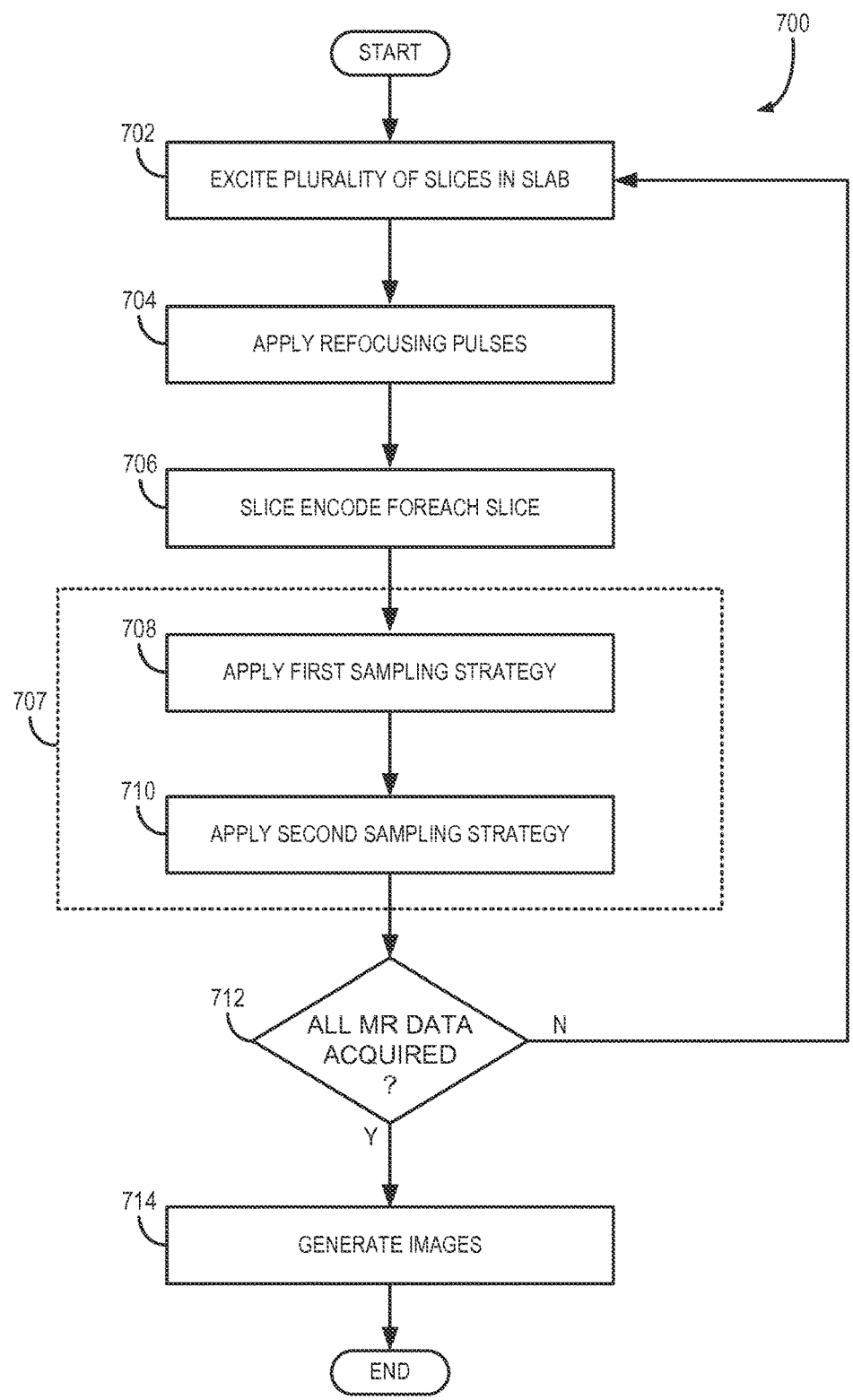
FIG. 7 is a flow chart setting forth steps for a method in accordance with the present disclosure.

The basic steps 700 of the above-described strategies and processes are illustrated in FIG. 7. In particular, at process block 702, an RF excitation pulse is applied to excite spins in a plurality of slice locations within the given slab. At process block 704, a successive plurality of RF refocusing pulses is applied to produce an echo train formed of a plurality of echoes. At process block 706 a varying slice-encoding gradient is performed to spatially encode the echo train relative to the slice locations within the given slab. As illustrated generally as 707, readout gradients are applied during the plurality of echoes to acquire MR data from the given slab. More particularly, the readout gradients including a first sampling strategy applied at process block 708 that defines a spiral-in k-space trajectory and a second sampling strategy applied at process block 710 that defines a spiral-out k-space trajectory. Thus, a spin-echo pulse sequence is performed that samples k-space using a spiral-in k-space trajectory and a spiral-out k-space trajectory in each TR to fully sample each echo train.

At decision block 712, a check is performed to determine if all MR data have been acquired. If not, the above-described process repeats, where each repetition can be thought of as another TR. For each subsequent TR, a different slab from the slab selected in a prior TR is excited at process block 702 to acquire MR data from the different slab using the spiral-in k-space trajectory and the spiral-out k-space trajectory. Once all MR data have been collected, at process block 714, the acquired MR data can be reconstructed into images.

By way of example, the above-described imaging approach was implemented on a Philips 3T Ingenia scanner. Data was acquired with the following imaging parameters: FOV=230×230×120 mm³, resolution=0.9×0.9×3 mm³, 4 slices/slab, 40 arms/slice, ADC=15.82 ms, TR=3000 ms, ETL=6, TE=100 ms, scan time=4:03. In addition, 2D Cartesian TSE data were also acquired as a reference with FOV=230×190×120 mm³, the same resolution and TR, with ETL=16, and TE=80 ms. Reconstruction was performed using a DFT method, along with a shifting-slab processing, data correction, gridding, and deblurring, as described. Two images were reconstructed (one for the spiral-in and one for the spiral-out part) and then combined to form the final image. Images obtained using an imaging approach in accordance with the present disclosure are without visible artifacts and comparable to images based on 2D Cartesian data acquisition approaches.

Figure 8:
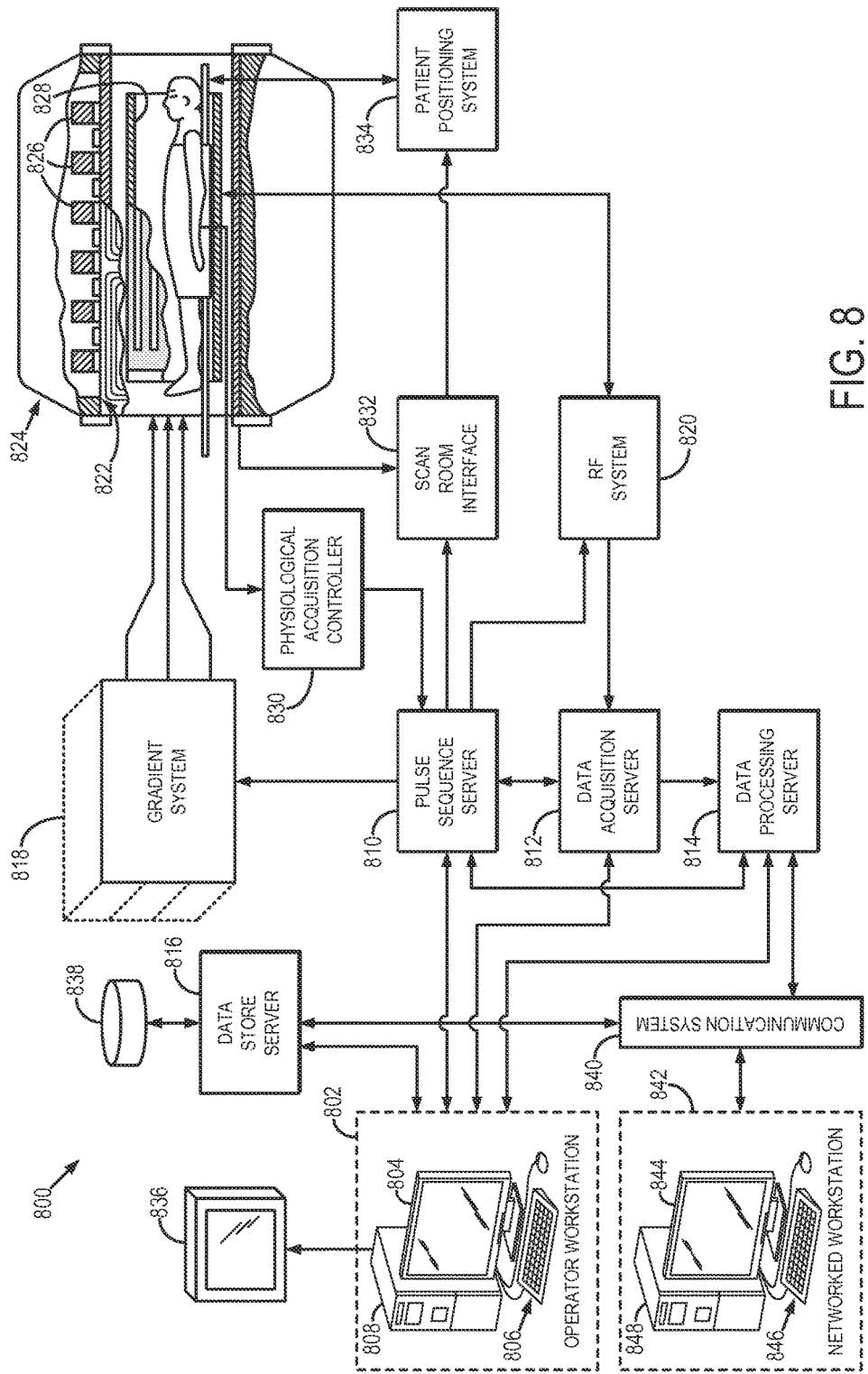
FIG. 8 is a block diagram of an example of a magnetic resonance imaging ("MRI") system configured in accordance with the present disclosure.

Referring particularly now to FIG. 8, an example of a magnetic resonance imaging (MRI) system 800 is illustrated. The MRI system 800 includes an operator workstation 802, which will typically include a display 804; one or more input devices 806, such as a keyboard and mouse; and a processor 808. The processor 808 may include a commercially available programmable machine running a commercially available operating system. The operator workstation 802 provides the operator interface that enables scan prescriptions to be entered into the MRI system 800. In general, the operator workstation 802 may be coupled to four servers: a pulse sequence server 810; a data acquisition server 812; a data processing server 814; and a data store server 816. The operator workstation 802 and each server 810, 812, 814, and 816 are connected to communicate with each other. For example, the servers 810, 812, 814, and 816 may be connected via a communication system 840, which may include any suitable network connection, whether wired, wireless, or a combination of both. As an example, the communication system 840 may include both proprietary or dedicated networks, as well as open networks, such as the internet.

The pulse sequence server 810 functions in response to instructions downloaded from the operator workstation 802 to operate a gradient system 818 and a radiofrequency (RF) system 820. Gradient waveforms necessary to perform the prescribed scan are produced and applied to the gradient system 818, which excites gradient coils in an assembly 822 to produce the magnetic field gradients $G_x$, $G_y$, and $G_z$ used for position encoding magnetic resonance signals. The gradient coil assembly 822 forms part of a magnet assembly 824 that includes a polarizing magnet 826 and a whole-body RF coil 828.

RF waveforms are applied by the RF system 820 to the RF coil 828, or a separate local coil (not shown in FIG. 8), in order to perform the prescribed magnetic resonance pulse sequence. Responsive magnetic resonance signals detected by the RF coil 828, or a separate local coil (not shown in FIG. 8), are received by the RF system 820, where they are amplified, demodulated, filtered, and digitized under direction of commands produced by the pulse sequence server 810. The RF system 820 includes an RF transmitter for producing a wide variety of RF pulses used in MRI pulse sequences. The RF transmitter is responsive to the scan prescription and direction from the pulse sequence server 810 to produce RF pulses of the desired frequency, phase, and pulse amplitude waveform. The generated RF pulses may be applied to the whole-body RF coil 828 or to one or more local coils or coil arrays (not shown in FIG. 8).

The RF system 820 also includes one or more RF receiver channels. Each RF receiver channel includes an RF preamplifier that amplifies the magnetic resonance signal received by the coil 828 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \tag{1};$$

and the phase of the received magnetic resonance signal may also be determined according to the following relationship:

$$\varphi = \tan^{-1}\left(\frac{Q}{I}\right). \tag{2}$$

The pulse sequence server 810 also optionally receives patient data from a physiological acquisition controller 830. By way of example, the physiological acquisition controller 830 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 810 to synchronize, or "gate," the performance of the scan with the subject's heart beat or respiration.

The pulse sequence server 810 also connects to a scan room interface circuit 832 that receives signals from various sensors associated with the condition of the patient and the magnet system. It is also through the scan room interface circuit 832 that a patient positioning system 834 receives commands to move the patient to desired positions during the scan.

The digitized magnetic resonance signal samples produced by the RF system 820 are received by the data acquisition server 812. The data acquisition server 812 operates in response to instructions downloaded from the operator workstation 802 to receive the real-time magnetic resonance data and provide buffer storage, such that no data is lost by data overrun. In some scans, the data acquisition server 812 does little more than pass the acquired magnetic resonance data to the data processor server 814. However, in scans that require information derived from acquired magnetic resonance data to control the further performance of the scan, the data acquisition server 812 is programmed to produce such information and convey it to the pulse sequence server 810. For example, during prescans, magnetic resonance data is acquired and used to calibrate the pulse sequence performed by the pulse sequence server 810. As another example, navigator signals may be acquired and used to adjust the operating parameters of the RF system 820 or the gradient system 818, or to control the view order in which k-space is sampled. In still another example, the data acquisition server 812 may also be employed to process magnetic resonance signals used to detect the arrival of a contrast agent in a magnetic resonance angiography (MRA) scan. By way of example, the data acquisition server 812 acquires magnetic resonance data and processes it in real-time to produce information that is used to control the scan.

The data processing server 814 receives magnetic resonance data from the data acquisition server 812 and processes it in accordance with instructions downloaded from the operator workstation 802. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 814 are conveyed back to the operator workstation 802 where they are stored. Real-time images are stored in a data base memory cache (not shown in FIG. 8), from which they may be output to operator display 812 or a display 836 that is located near the magnet assembly 824 for use by attending physicians. Batch mode images or selected real time images are stored in a host database on disc storage 838. When such images have been reconstructed and transferred to storage, the data processing server 814 notifies the data store server 816 on the operator workstation 802. The operator workstation 802 may be used by an operator to archive the images, produce films, or send the images via a network to other facilities.

The MRI system 800 may also include one or more networked workstations 842. By way of example, a networked workstation 842 may include a display 844; one or more input devices 846, such as a keyboard and mouse; and a processor 848. The networked workstation 842 may be located within the same facility as the operator workstation 802, or in a different facility, such as a different healthcare institution or clinic.

The networked workstation 842, whether within the same facility or in a different facility as the operator workstation 802, may gain remote access to the data processing server 814 or data store server 816 via the communication system 840. Accordingly, multiple networked workstations 842 may have access to the data processing server 814 and the data store server 816. In this manner, magnetic resonance data, reconstructed images, or other data may exchanged between the data processing server 814 or the data store server 816 and the networked workstations 842, such that the data or images may be remotely processed by a networked workstation 842. This data may be exchanged in any suitable format, such as in accordance with the transmission control protocol (TCP), the internet protocol (IP), or other known or suitable protocols.

Figure 9:
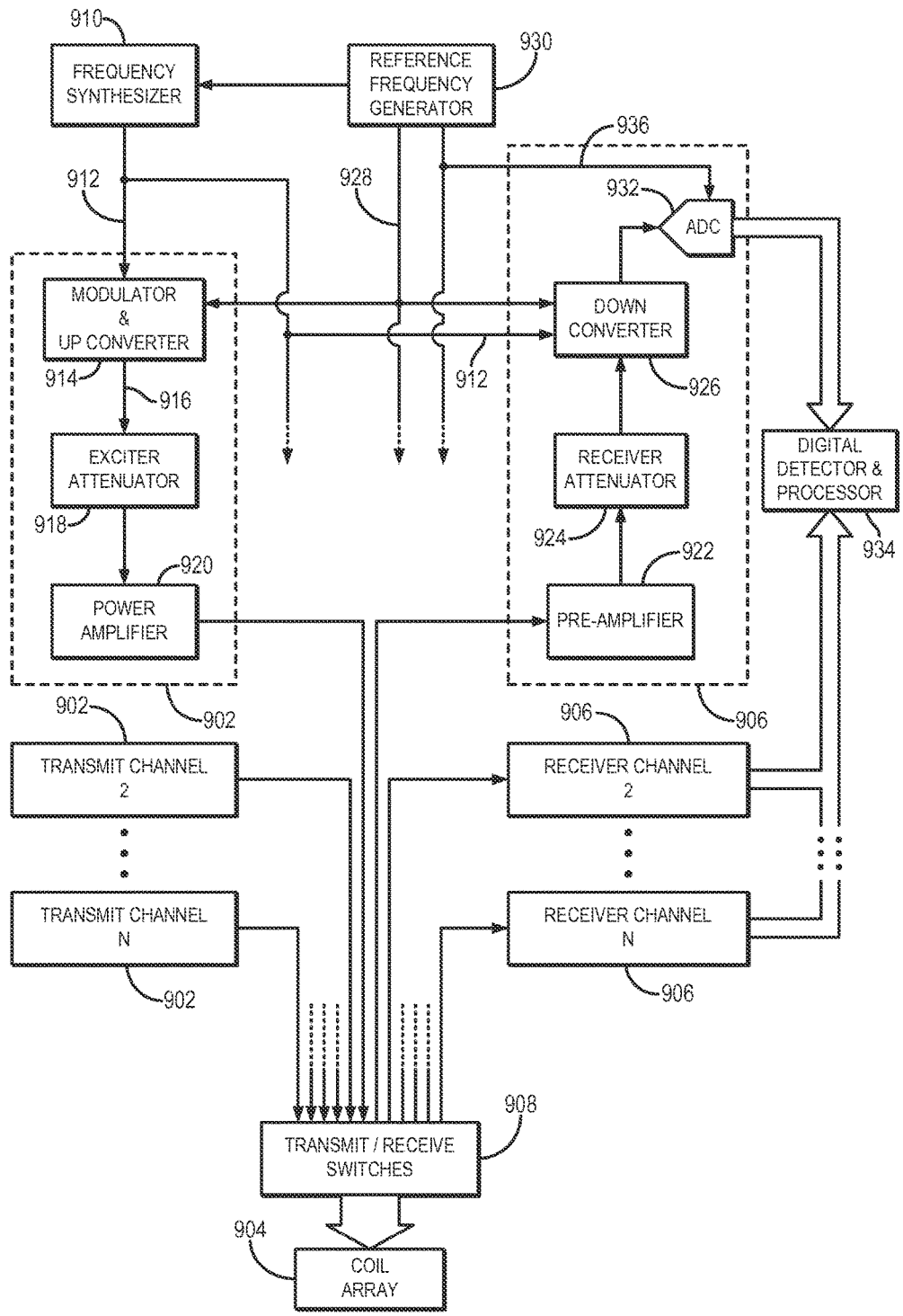
FIG. 9 is a schematic diagram of a transmitter and receiver section of the MRI system of FIG. 8, for use in accordance with the present disclosure.

As shown in FIG. 8, the radiofrequency (RF) system 820 may be connected to the whole body RF coil 828, or, as shown in FIG. 9, a transmission section of the RF system 820 may connect to one or more transmit channels 902 of an RF coil array 904 and a receiver section of the RF system 820 may connect to one or more receiver channels 906 of the RF coil array 904. The transmit channels 902 and the receiver channels 906 are connected to the RF coil array 904 by way of one or more transmit/receive (T/R) switches 908. The receiver channel 906 may also be an assembly of coils separate from the transmit coil array. In such a configuration, the T/R switches 908 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 9, the RF system 820 includes one or more transmit channels 902 that produce a prescribed RF electromagnetic field. The base, or carrier, frequency of this RF field is produced under control of a frequency synthesizer 910 that receives a set of digital signals from the pulse sequence server 810. These digital signals indicate the frequency, amplitude, and phase of the RF carrier signal produced at an output 912. The RF carrier is applied to a modulator and, if necessary, an up converter 914 where its amplitude and phase is modulated in response to a signal, R(t), also received from the pulse sequence server 810. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 916 is attenuated by an attenuator circuit 918 that receives a digital command from the pulse sequence server 810. The phase of the RF pulse may also be altered using phase shifters (not shown). The modulated RF pulses are then applied to a power amplifier 920 that drives one element of the RF coil array 904, or several such elements that are electrically coupled. Multiple transmit channels then drive other elements of the multichannel transmit coil array.

The MR signal produced by the subject is picked up by the RF coil array 904 and applied to the inputs of the set of receiver channels 906. A preamplifier 922 in each receiver channel 906 amplifies the signal, which is then attenuated, if necessary, by a receiver attenuator 924 by an amount determined by a digital attenuation signal received from the pulse sequence server 810. The received signal is at or around the Larmor frequency, and this high frequency signal may be down converted in a two step process by a down converter 926. In an example of such a process, the down converter 926 first mixes the MR signal with the carrier signal on line 912 and then mixes the resulting difference signal with a reference signal on line 928 that is produced by a reference frequency generator 930. The MR signal is applied to the input of an analog-to-digital (A/D) converter 932 that samples and digitizes the analog signal. As an alternative to down conversion of the high frequency signal, the received analog signal can also be detected directly with an appropriately fast A/D converter and/or with appropriate undersampling. The sampled and digitized signal may then be applied to a digital detector and signal processor 934 that produces in-phase (I) and quadrature (Q) values corresponding to the received signal. The resulting stream of digitized I and Q values of the received signal are output to the data acquisition server 812. In addition to generating the reference signal on line 928, the reference frequency generator 930 also generates a sampling signal on line 936 that is applied to the A/D converter 932.

In summary, the present disclosure provides systems and methods to implement a fast spin echo imaging technique that makes use of a spiral in/spiral-out trajectory k-space traversal, along with a non-uniform phase encoding along the slice direction, and a shifting-slab approach. As described, the spiral-in/spiral-out image approach allows acquisition of true spin echoes at the center of k-space, and may be used to produce separate fat/water images. The variable $k_z$ spacing allows for well-shaped slice profile, that is better than sinc, which is typical for 3D methods and not good in practice. As a result, fewer RF pulses (e.g. 6) may be used, which results in less power deposition a patient, and less magnetization transfer suppression of signals. Also, it allows use higher bandwidth (better shaped) RF pulses for better slab profiles.

In addition, the multi-slab approach provided by the present disclosure is SNR efficient. By contrast, pure 3D turbo spin echo techniques are really inefficient, since long spin recovery period are required. Also, for typical 2D imaging techniques, say a 15 cm Z coverage with 3 mm thick slices, would require a TR of roughly 15 sec, which would be really inefficient. Moreover, the shifting slab approach implemented herein removes slab boundaries, while the spiral implementation mitigates their modulation effect on the in-plane data.

Features suitable for combinations and sub-combinations would be readily apparent to persons skilled in the art upon review of the present application as a whole. The subject matter described herein and in the recited claims intends to cover and embrace all suitable changes in technology.

The invention claimed is:

1. A method for controlling a magnetic resonance imaging (MRI) system, the method comprising:
    directing the MRI system to perform a pulse sequence that, in a given repetition time (TR), includes:
        (i) generating a RF excitation pulse to excite spins in a plurality of slice locations within a selected slab to produce an echo train from the selected slab that is formed by a plurality of echoes;
        (ii) applying a slice-encoding gradient to spatially encode each of the plurality of echoes associated with a different slice in the selected slab; and
        (iii) applying readout gradients during the echo train to acquire MR data from the selected slab, the readout gradients including a first sampling strategy that defines a spiral-in k-space trajectory and a second sampling strategy that defines a spiral-out k-space trajectory;
    wherein, for each TR, the MRI system is directed to repeat the pulse sequence such that each of a plurality of subsequent selected slabs is excited and MR data is acquired from each of the plurality of subsequent selected slabs; and
    further comprising applying the readout gradients relative to respective refocusing pulses to align each of the plurality of echoes with a center of plane of k-space.

2. The method of claim 1, wherein the slice-encoding gradient is configured to generate a non-uniform phase encoding along a selected direction in k-space.

3. The method of claim 1, wherein step iv further includes acquiring calibration data at a center of k-space.

4. The method of claim 1, wherein the selected slab and each of the plurality of subsequent selected slabs are separated along a slice direction by a selected shift value.

5. The method of claim 1, further comprising transforming data in the MR data acquired from each different slab to corresponding locations along a slice direction of the slab.

6. The method of claim 1, further comprising performing a gridding reconstruction process using the MR data acquired from the selected slab and each of the plurality of subsequent selected slabs.

7. The method of claim 6, wherein the gridding reconstruction process includes using a discrete Fourier transform technique.

8. A method for controlling a magnetic resonance imaging (MRI) system, the method comprising:
    directing the MRI system to perform a pulse sequence that, in a given repetition time (TR), includes:
        (i) generating a RF excitation pulse to excite spins in a plurality of slice locations within a selected slab to produce an echo train from the selected slab that is formed by a plurality of echoes;
        (ii) applying a slice-encoding gradient to spatially encode each of the plurality of echoes associated with a different slice in the selected slab; and
        (iii) applying readout gradients during the echo train to acquire MR data from the selected slab, the readout gradients including a first sampling strategy that defines a spiral-in k-space trajectory and a second sampling strategy that defines a spiral-out k-space trajectory;
    wherein, for each TR, the MRI system is directed to repeat the pulse sequence such that each of a plurality of subsequent selected slabs is excited and MR data is acquired from each of the plurality of subsequent selected slabs;
    generating a successive plurality of RF refocusing pulses to produce the echo train from the selected slab that is formed by the plurality of echoes; and
    applying phase-rewinding gradients along a slice direction after each echo train to restore an accumulated phase before a subsequent one of the RF refocusing pulses.

9. A magnetic resonance imaging (MRI) system, the system comprising:
    a magnet system configured to generate a polarizing magnetic field about at least a portion of a subject arranged in the MRI system;
    a plurality of gradient coils configured to apply a gradient field to the polarizing magnetic field;
    a radio frequency (RF) system configured to apply an RF excitation field to a region of interest (ROI) in the subject and acquire MR image data from the ROI; and
    a computer system programmed to control the plurality of gradient coils and the RF system to perform a pulse sequence that varies with each repetition time (TR), wherein the pulse sequence for a given TR includes performing the following for a given slab:
        (i) applying an RF excitation pulse, using the RF system, to excite spins in a plurality of slice locations within the given slab;
        (ii) generating a successive plurality of RF refocusing pulses, using the RF system, to produce an echo train including a plurality of echoes;
        (iii) applying a varying slice-encoding gradient, using the plurality of gradient coils, to spatially encode the echo train relative to the slice locations within the given slab; and
        (iv) applying readout gradients during the plurality of echoes, using the plurality of gradient coils, to acquire MR data from the given slab, wherein the readout gradients including a first sampling strategy that defines a spiral-in k-space trajectory, and a second sampling strategy that defines a spiral-out k-space trajectory;
    wherein for each subsequent TR, a different slab from the given slab in a prior TR is excited to acquire MR data from the different slab using a different spiral-in k-space trajectory and a different spiral-out k-space trajectory.

10. The system of claim 9, wherein the pulse sequence further includes applying phase-rewinding gradients along a slice direction to restore an accumulated phase before a subsequent one of the RF refocusing pulses.

11. The system of claim 9, wherein each varying slice-encoding gradient generates a non-uniform phase encoding along a given direction in k-space.

12. The system of claim 9, wherein the computer system is further configured to control a timing of the readout gradients relative to the refocusing pulses to align each of the plurality of echoes with a center of a plane of k-space.

13. The system of claim 9, wherein computer system is further configured to perform the readout gradients to acquire calibration data at a center of k-space.

14. The system of claim 9, wherein the given slab and each different slab are separated along a slice direction by a shift value.

15. The system of claim 9, wherein the computer system is further configured to transform the MR data acquired from each different slab to corresponding locations along a slice direction of the slab.

16. The system of claim 9, wherein the computer system is further configured to perform a gridding reconstruction process using MR data acquired from the given slab and different slab.

17. The system of claim 16, wherein the gridding reconstruction process includes using a discrete Fourier transform technique.

18. A magnetic resonance imaging (MRI) system, the system comprising:
 a magnet system configured to generate a polarizing magnetic field about at least a portion of a subject arranged in the MRI system;
 a plurality of gradient coils configured to apply a gradient field to the polarizing magnetic field;
 a radio frequency (RF) system configured to apply an RF excitation field to a region of interest (ROI) in the subject and acquire MR image data from the ROI; and
 a computer system programmed to control the plurality of gradient coils and the RF system to perform a spin-echo pulse sequence that applies a plurality of RF refocusing pulses and a plurality of readout gradients during each echo train to sample k-space using a spiral-in k-space trajectory and a spiral-out k-space trajectory to fully sample each echo train, wherein each echo train comprises a plurality of echoes, and wherein the application of the readout gradients relative to the refocusing pulses align each of the plurality of echoes with a center of plane of k-space.

19. The MM system of claim 18, wherein each echo train is centered at an origin of k-space.

* * * * *

UNITED STATES PATENT AND TRADEMARK OFFICE
CERTIFICATE OF CORRECTION

PATENT NO. : 10,222,439 B2
APPLICATION NO. : 15/305259
DATED : March 5, 2019
INVENTOR(S) : James Grant Pipe Page 1 of 1

It is certified that error appears in the above-identified patent and that said Letters Patent is hereby corrected as shown below:

In the Claims

Column 16, Claim 19, Line 17, "MM" should be --MRI--.

Signed and Sealed this
Sixteenth Day of April, 2019

Andrei Iancu
*Director of the United States Patent and Trademark Office*